United States Patent [19]

Weisenburger

[11] 3,960,424

[45] June 1, 1976

[54] MULTI-CONTACT SPRING CONNECTOR FOR BOARD TO BOARD CONNECTIONS

[75] Inventor: Lawrence Paul Weisenburger, Winston-Salem, N.C.

[73] Assignee: AMP Incorporated, Harrisburg, Pa.

[22] Filed: Dec. 19, 1974

[21] Appl. No.: 534,387

Related U.S. Application Data

[63] Continuation-in-part of Ser. No. 511,881, Oct. 2, 1974.

[52] U.S. Cl. .......... 339/17 M

[51] Int. Cl.$^2$ .......... H05K 1/12

[58] Field of Search .......... 339/17 C, 17 CF, 17 LM, 339/17 M; 317/101 CC

[56] References Cited

UNITED STATES PATENTS

| | | | |
|---|---|---|---|
| 3,123,800 | 3/1964 | Phelps et al. | 339/17 LM |
| 3,173,732 | 3/1965 | James | 317/101 CC X |
| 3,551,750 | 12/1970 | Sterling | 339/17 LM |
| 3,858,154 | 12/1974 | William | 339/17 LM |

OTHER PUBLICATIONS

Becon Connector; "Becon 90° Double 10," Dec., 1961; Brown Engineering Co., Part No. 2700–01.

Becon Connector; "Becon 180° Single 10," Dec., 1961; Brown Eng. Co., Part No. 2802–01.

*Primary Examiner*—Joseph H. McGlynn
*Assistant Examiner*—Craig R. Feinberg
*Attorney, Agent, or Firm*—Robert W. Pitts; Frederick W. Raring; Jay L. Seitchik

[57] ABSTRACT

A connector for connecting corresponding terminal pads on parallel panel-like surfaces such as printed circuit boards utilizes thin etched metallic conductors to generate the necessary contact pressures. A cooperating rigid support member enables springs formed by the shaped conductors to exert a relatively high contact pressure while allowing a large deflection of the spring conductor.

20 Claims, 9 Drawing Figures

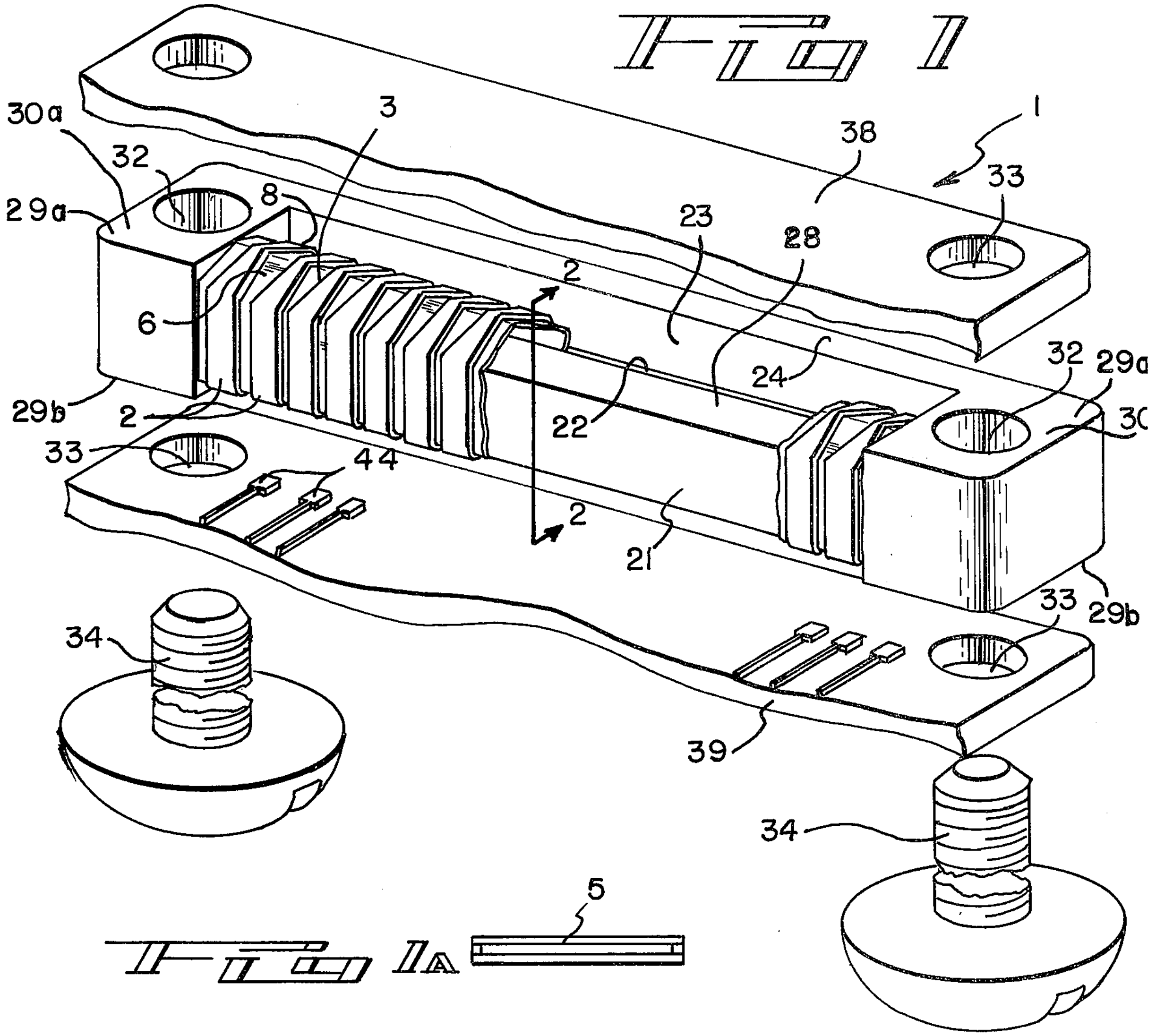
FIG. 1
FIG. 1A
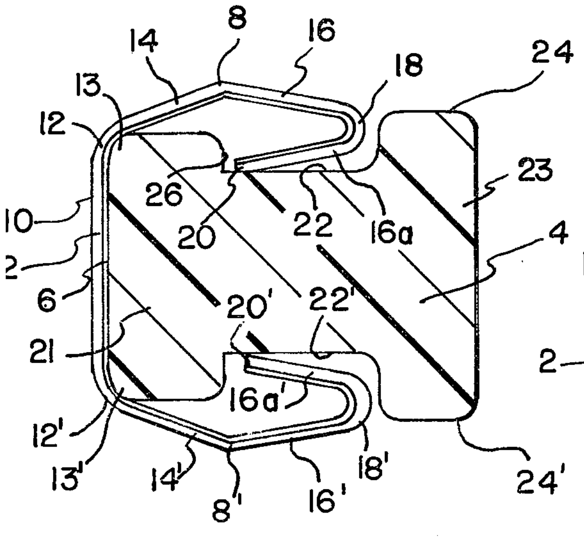
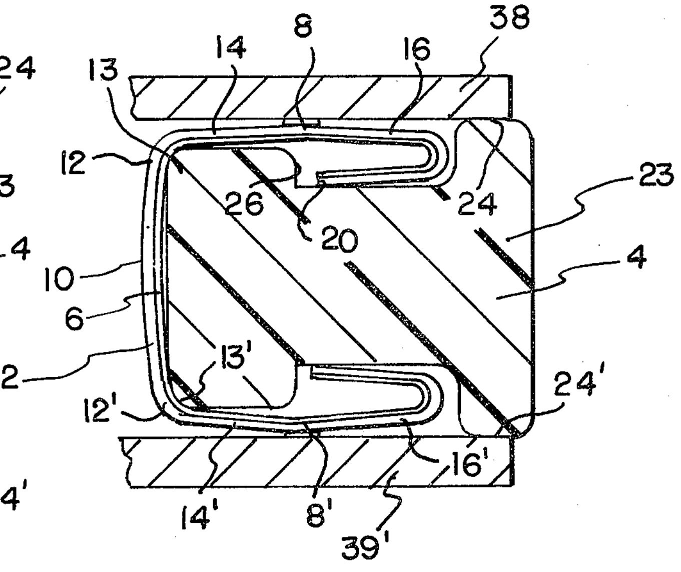
FIG. 2
FIG. 3

MULTI-CONTACT SPRING CONNECTOR FOR BOARD TO BOARD CONNECTIONS

BACKGROUND OF THE INVENTION

1. Field of Invention

This application is a continuation-in-part of application Ser. No. 511,881 filed Oct. 2, 1974.

This invention incorporates the essential elements of the invention disclosed and claimed in the above application and is an improvement thereover.

This invention relates to the electrical connection of separate printed circuit boards or the like. In particular this invention comprises a connector suitable for use with closely spaced corresponding terminal pads on parallel circuit boards or substrates or the like.

2. Description of the Prior Art

U.S. Pat. Nos. 3,239,798 and 3,401,369 disclose related prior art devices. As with the present invention, each of these disclosures show a series of parallel conductive elements mounted on a flexible dielectric material. In the first of these disclosures, the conductive members or paths form the springs which supply the forces necessary to establish an electrical contact, That device, however, employs a conventional C-spring arrangement. It does not employ the interaction of the conductors and support means envisaged with the instant invention. High contact forces are desirable since expensive gold plating must be resorted to where an insufficient force is available. U.S. Pat. No. 3,401,369 discloses a laminate comprising a ground plane and interconnection contact members on opposite sides of a dielectric film. Both the ground plane and the interconnection contact members would furnish a portion of the spring force for that device. In the instant invention the entire spring force would be supplied by the conductive contact members when suitably mounted against a rigid supporting means.

While the preferred embodiment of this invention employs a number of conductive paths adhering to a thin dielectric film, the essence of the invention may be employed with single conductive elements. The geometry incorporated in this invention might then be employed to give greater contact pressures than would be available with a conventional C-spring such as that shown in U.S. Pat. No. 3,173,732.

SUMMARY OF THE INVENTION

With this invention a solderless contact between corresponding terminal pads on parallel circuit boards or the like is established. The contact is established since the contact point or area of the terminal is resiliently urged against the terminal pads. With this invention the entire contact force or pressure is obtained by the spring action of the contact terminal element itself. The contact terminal is bent to form several longitudinal sections. It remains symmetrical about its midpoint. These sections form multiple spring systems. When mounted against a suitable rigid supporting surface, these separate spring systems combine to exert a relatively high force against properly positioned terminal pads. This is especially desirable in view of the thin contact elements visualized for use in contact elements employing this invention. In addition to the high contact pressures attained, the geometry of the contact elements also results in a large deflection of their ends. Both high contact forces and relatively large deflections are desirable in applications for which use of this invention is visualized. This invention is considered especially desirable for fairly small installations. In such small applications, where numerous conductive elements are needed, one way of obtaining the required close spacing is by affixing the conductive elements to a thin dielectric film which acts essentially as a carrier. One desirable method of forming this conductive element is by etching conductive material on which has been deposited a thin polymeric film.

Accordingly, the objects of this invention include the achievement of high contact forces by the spring action of thin conductive terminal elements. The achievement of contact pressures large enough to avoid the necessity of gold plating is sought.

Another object is to provide a connector which utilizes an etched laminate. A metallic foil laminated to a polymeric film is selectively etched to form a plurality of side-by-side conductive paths or elements. This etched laminate is a relatively economical manufacturing technique for fabricating such small connectors. Also the etched laminate can be produced to meet a wide variety of dimensional requirements. Such diverse sizes result from the lack of standardization found in solid state applications where such connectors would be utilized. A wide variety of configurations, terminal pad locations, terminal pad spacings, board to board spacings and other variables must be dealt with. This etching technique and the configuration employed by this invention would be readily adaptable to such dimensional changes.

A further object of this invention is to provide a connector that maintains high contact pressures over a relatively large contact point deflection range. When two parallel panel-like members such as printed circuit boards are attached at their ends, they may warp. This results in an uneven deflection of the separate conductors along the length of the connector. A high contact force for each conductor is still necessary.

These and other objects of the invention are achieved by devices employing this invention and especially in the preferred embodiments described. Changes will occur to those skilled in the art which will result in devices differing from the preferred embodiments shown but nevertheless incorportating the essence of this invention.

BRIEF DESCRIPTION OF THE DRAWINGS

FIG. 1 is a fragmentary isometric view showing a connector just prior to attachment between two panel-like members.

FIG. 1A shows the size envisioned for a 20 contact connector.

FIG. 2 is a sectional view showing a conductor mounted on a support block but in the relaxed state.

FIG. 3 also shows a sectional view but with opposed panel-like members affixed and the spring-like conductor compressed.

DETAILED DESCRIPTION

Figure 4:
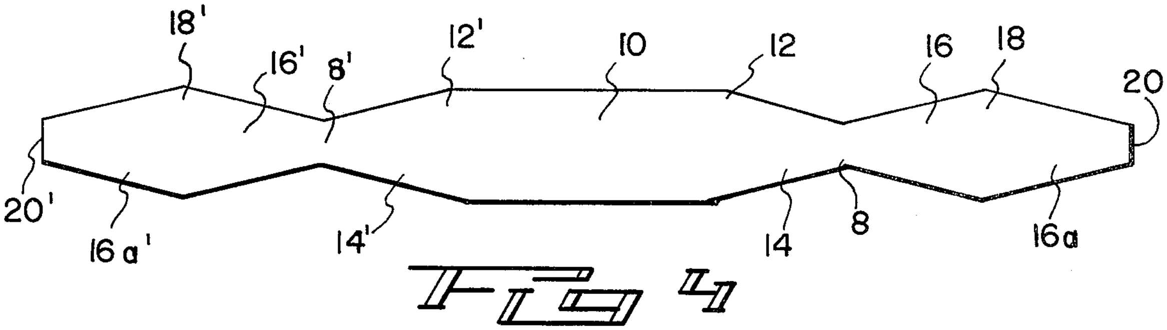
FIG. 4 is a plane view illustrating the geometry of a single conductor before being bent into the configuration of FIG. 2.

It should be noted that the drawings depicting the various embodiments of this invention are presented in a much enlarged scale. FIG. 1A is included to give an indication of the actual size of the connectors envisioned. Twenty conductors would be aligned along the 1 inch length of the support member 5 shown in FIG. 1A.

FIG. 1 shows a connector 1 comprising a plurality of conductive contact elements or terminals 2 adhered to a thin dielectric film 6 and mounted on a supporting member 4. The material forming conductors 2 is an electrically conductive metal having spring characteristics. Beryllium-copper is one metal with these desirable characteristics. The dielectric film 6 consists of a thin flexible or pliable material such as a polyamide-imide such as Kapton (a trademark of DuPont Co.). The supporting member 4 comprises a rigid block made of an insulating material such as glass filled polyester such as Valox (a trademark of General Electric).

Connectors in accordance with the invention can be made in any desired size and one practical application is intended for terminal pads on 0.050 inch centers. The film 6 for a connector of this type may be extremely thin — for example 0.001 inch. In view of the relatively high contact pressures desired the conductors 2 can be extremely thin — for example 0.003 inch. When fully deflected a 0.003 inch thick conductor of the configuration resulting from this invention would produce between 130 and 140 grams of force. If an etched laminate, formed by laminating a conductive metal with spring properties on a thin dielectric film and then selectively etching the metal to form conductors is used, a thin conductor will result. Edge effects tend to limit the thickness of the metal on an etched laminate.

Figure 5:
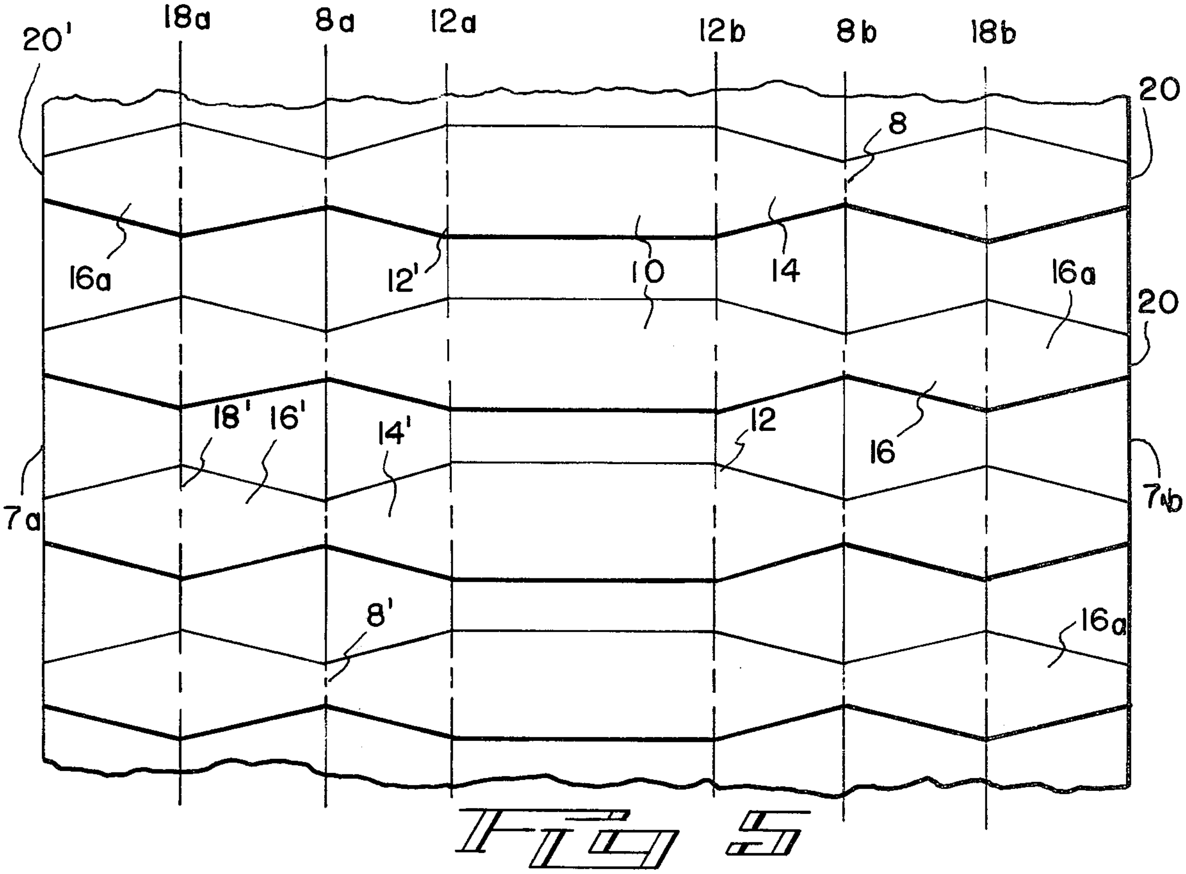
FIG. 5 shows a plurality of conductors in side-by-side relationship on a polymeric film.

FIGS. 4 and 5 illustrate one embodiment of a contact terminal used with this invention. FIG. 4 shows a single flat contact terminal. This terminal comprises a number of tapered segments. The purpose of the taper will be described later, and a rectangular terminal could be used. Starting from the right in FIG. 4, the end portions 20 of terminal 2 are relatively narrow. Segment **16*a* has divergent sides and is a mirror image of Segment 16 with with section 18 being the intermediate point of greatest width. The sides of segment 16 converge to form a restricted width portion 8 which functions as a contact point or zone. Segment 14 is a divergent width segment extending from location 8 to location 12. A central portion or web 10 is of constant width and joins two points 12. It should be apparent that similar segments are located on either side of central portion or web 10**. In the drawings primed numerals are used to distinguish similar but oppositely facing segments.

FIG. 5 shows a number of contact terminals 2 in side-by-side relation on a dielectric film 6. The ends 20 of terminal 2 are aligned along parallel opposite sides **7*a* and 7*b* of film 6. A number of bend lines 12*a* and 12*b*, 8*a* and 8*b*, 18*a* and 18*b* are formed, joining points at which the taper of terminals 2 changes. In this embodiment, these are points at which the width reaches either a maximum or a minimum. The side-by-side terminals 2 are formed into a generally U-shaped member with a reversely formed portion adjacent to each end when the film mounted contact terminal strip 3 is formed along these bend lines. FIG. 2 shows the shape of one terminal 2** after it has been bent along these lines.

The film mounted contact terminal strip 3 as shown in FIG. 1 is mounted on supporting means 4 to form connector assembly 1. The connector assembly 1 is shown between two panel-like members 38 and 39. Terminal pads 44 aligned in a row are shown on the lower panel-like member 39. Substantially identical corresponding terminal pads would be located on the undersurface of panel-like member 38. The connector assembly 1 can be mounted between panel-like members 38 and 39 so that contact is established between corresponding terminal pads on the two panel-like members. Supporting means 4 comprises a bar-like member of a rigid insulating material. Panel supports **30*a* and 30*b* are located on opposite ends of support member 4. Support ends 30*a* and 30*b* are essentially rectangular, each having opposite faces 29*a* and 29*b* with a circular hole 32 extending between faces 29*a* and 29*b*. The faces 29*a* and 29*b* are spaced-apart by a distance equal to the desired spacing between the panel-like members 38 and 39 in the assembled configuration. Appropriate holes 33 in each panel-like member are aligned with the connector holes 32 so that screws 34 may be inserted and the entire assembly can be rigidly fastened together. A forward bar-like member 21 extends between the connector support ends 30*a* and 30*b*. This bar-like member has opposite faces 28 and 28' which are essentially parallel to but recessed from the plane of faces 29*a* and 29*b*. The film mounted contact terminal strip 3, shown here as being broken away in the center, is positioned around bar-like member 21 as shown. A ridge 23 extends along the rearward portion of support member 4. The opposite faces of ridge 23 are respectively co-planar with faces 29*a* and 29*b*. The top face 24 of ridge 23 can be seen in FIG. 1. A channel 22 is located between bar-like member 21 and ridge 23. This channel extends along the length of support member 4 between ends 30*a* and 30*b* and forms a means for retaining the ends 20 of contact terminals 2 when they are mounted around bar-like member 21** as shown.

FIG. 2 is a view taken along section 2—2 in FIG. 1. As indicated earlier, FIG. 2 shows the shape of a contact terminal 2 when mounted on support member 4. Contact terminal 2 is substantially U-shaped with central portion 10 joining two substantially equivalent legs or sidewalls comprising segments 14, 16 and **16*a*. A bend 12 is located on either end of central portion 10 at a point adjacent to corner 13 in bar-like member 21. Segments 14 extend obliquely on either end of central portion 10 to contact zones 8. The contact zones 8 on the top and the bottom of the section shown in FIG. 2 are formed by the intersection of segment 14 and segment 16. When the contact terminal spring 2 is in its relaxed or extended state, opposite contact zones 8 extend beyond any portion of support member 4. Segments 16 extend from contact zone 8 to bend lines 18. From there segments 16*a*, which are substantially equivalent to segments 16 extend from section 18 to the end 20 of the contact terminal. Segments 16*a* are inwardly reversely formed about bend line 18 so that the ends 20 are directed toward the inner side of central portion or web 10. It should be noted that the conductive metal forming contact terminal 2 is located around the external surface of dielectric film 6. With the metal located on the outside and contact zones 8** extending beyond the support member, contact with the terminal pads can be established as the panel-like members are brought into position.

FIG. 2 also shows the important features of support member 4. Bar-like member 21 is positioned adjacent to the inner surface of central portion 10 with corners 13 proximate to bend lines 12. The opposite ends 20 of terminal 2 are located in opposite channels 22 with the ends 20 being proximate to sides 26. Panel support ridge 23 forms the other side of each channel with opposite faces 24 being spaced apart by a distance greater than the spacing of faces 28.

FIG. 3 is a view taken along the same section as that shown in FIG. 2, but with panel-like members 38 and 39 positioned against faces 24 as they would be in the completed assembly. It can be seen that the panels 38 and 39 compress the contact terminal spring 2 by acting against contact zones 8. The entire force transmitted from the spring to the opposite panel-like members 38 and 39 would then be exerted at contact zones 8. Upon initial compression of the spring, ends 20 abut surfaces 26 and further lateral movement is prohibited. This action results in the establishment of pivots about corners 13. The ends 20 are also restrained against movement toward each other. It can be seen that central portion or web 10 is deflected as a result of the moments exerted about these pivots. The establishment of supports restricting movement of ends toward each other and of the intermediate pivots about corners 13 leads to the developement of relatively large contact pressures at zones 8. Substantially all of the contact terminal 2 is used to develop these spring forces as well. In addition to the large contact forces which can be obtained, a relatively large spring deflection also results. Both a large force and a large deflection are desirable in the instant applications.

As previously noted, contact terminals 2 consist of a series of tapered segments. This taper is illustrated in FIGS. 4 and 5. The taper serves essentially two purposes. The first purpose is related to the narrow width of the contact points or zones 8. By reducing the area at the point where the terminal establishes contact with a corresponding terminal pad, an increased contact pressure can be attained for the same force. It should be noted that contact is established along the intersection of two oblique segments 14 and 16. This constitutes a rather simple method for attaining higher contact pressures. A raised boss might also be employed at the contact point if the required contact pressure could not be otherwise obtained.

The taper serves a second purpose however. The taper of segments 14, 16 and **16*a* on each end of the contact terminals evenly distributes the stresses along these portions of the conductor and encourages them to deflect with a uniform curvature along their lengths. This uniform distribution of stress results in a greater deflection. The points of localized maximum stress 12 and 18 have the maximum width. Central segment 10 between the two points 12 is a portion having a constant stress equal to the stress at points 12 bordering segment 10.**

This particular embodiment of the contact terminal employing this invention can be thought of as comprising multiple spring systems adjacent to either end. First and second matched but separate spring systems on each end of a single terminal combine to furnish the total force exerted at any one contact point or zone 8. In FIG. 2 it can be seen that a first spring system comprises segments 16 and **16*a* which are obliquely formed so that they act as a double cantilever spring with a load applied at the two ends of the double cantilever spring. In FIG. 3 the two ends of the upper double cantilever spring would be contact zone 8 and 20 of conductor 2. A second spring system consists of segment 14 with a pivot established by corner 13 and located proximate to bend 12 and the half of central segment 10 adjacent to the particular contact point 8 in question. Referring to FIG. 2, one such spring system adjacent to the upper contact point 8 would consist of upper segment 14, upper bend 12, and the upper half of central segment 10. A substantially identical spring system would be formed by the lower elements. Initially this second spring system might be thought of as a cantilever arm, segment 14, fixed at point 12 with point 8 being the hypothetical free end of this cantilever. Such, however, is not the case. The pivot formed at bend 12 and support corner 13 is not fixed as with a true cantilever. If a load is applied at point 8 as would be the case with this invention, segment 14 would deflect much as a true cantilever but the central segment 10 would also deform due to the moments established at bend 12. This deflection of central segment 10 would result in an increased deflection at contact point 8.**

FIG. 3 shows a contact terminal loaded so that the two spring systems each contribute a force acting through contact point 8. The first spring system comprising segments 16 and **16*a* has been compressed as shown. The other or second spring system has also been loaded by placing the two panel-like members 38 and 39 in position. Each segment 14 would be deflected much as a true cantilever and the bending in central segment 10 is illustrated in FIG. 3. The intermediate points established at bends or points 12 adjacent to corners 13 act to define the maximum stress existing in this portion of the contact terminal. This stress is constant throughout central segment 10 which is in effect a beam loaded by moments at each end. Were it not for the pivots the maximum stress for a member of the shape shown in FIG. 4 would be located at the midpoint of segment 10. If this were the case, the forces which would be applied at contact points 8 would be less than may be applied with this invention. The portion of any one conductor between oppositely directly contact zones 8 and 8' would contribute a force component at each contact zone. In effect then, the two halves of the conductor between zones 8 and 8'** would be acting as substantially identical but separate second spring systems. This is the sense in which the second spring system has been discussed above.

Figure 6:
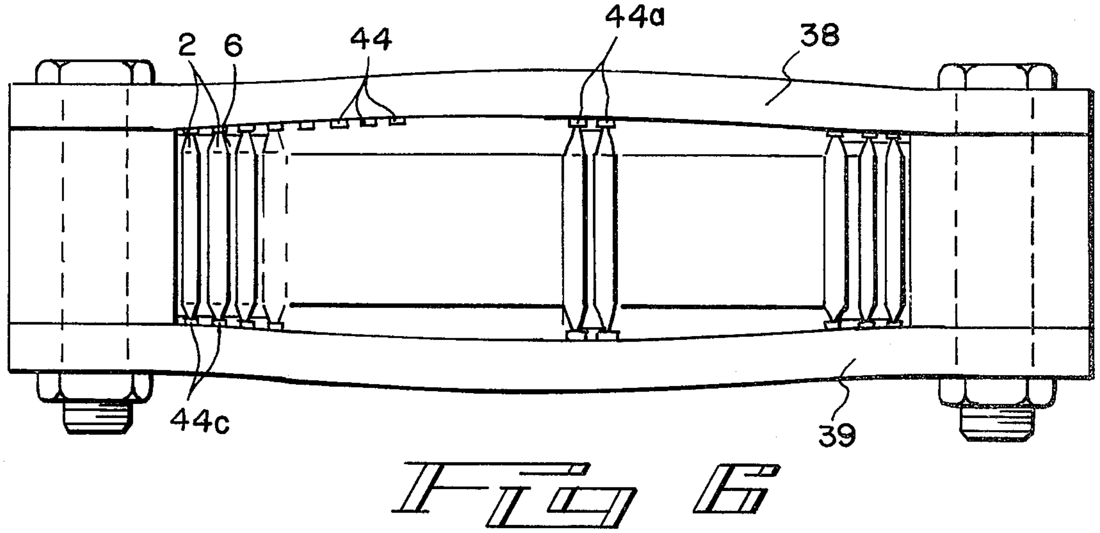
FIG. 6 shows the potential warping in two parallel panel-like members and the uneven deflection of the spring-like conductors.
Figure 7:
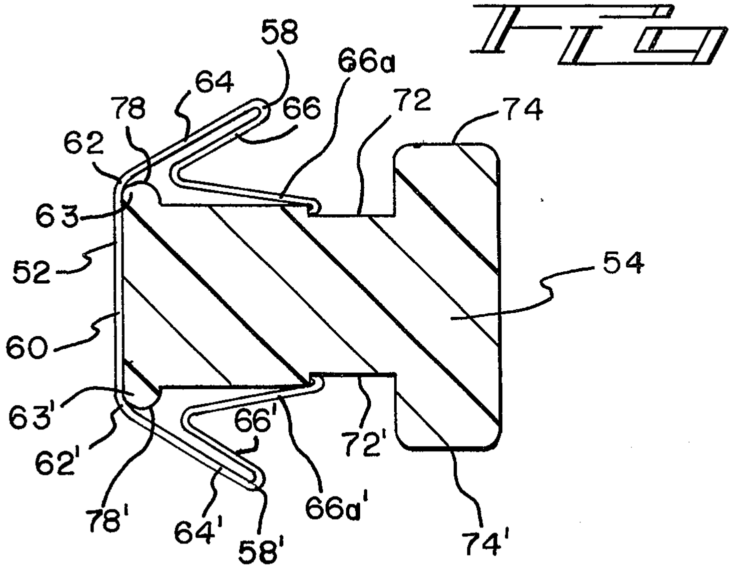
FIG. 7 shows an alternate embodiment of the invention.

For applications in which this invention is to be employed a high contact pressure and a large deflection are desired while using thin metallic elements as both conductors and springs. The need for high contact pressure has been previously discussed. FIG. 6 indicates one consideration making a large deflection and an accompanying low spring rate also desirable. When two panel-like members 38 and 39 are secured in this manner shown in FIG. 6, the panel-like members may not remain perfectly parallel. The panel-like members might warp or bow as shown in FIG. 6. In that figure, the terminal pads **44*a* located in the center are spaced apart by a greater distance than the terminal pads 44*c*** near either end. The deflection of those contact terminals near the center would be less than the deflection of those near the ends. Presumably, however, the same contact pressure would be required for connecting all terminal pads. It is important therefore that such reduced deflection not result in a large loss in contact pressure.

Turning now to FIG. 9 which shows a simplified plot of force versus deflection, curves I, II and III represent the spring characteristics of three unspecified configurations. Configuration I demonstrates a desirable low spring rate (slope) but also a relatively low force. Configuration II illustrates a high force or contact pressure attained at a relatively low deflection. Configuration III represents a desirable combination of I and II wherein both a high force attained at a reasonably large deflection (i.e. a low spring rate). The curve of Configuration III represents the type which might be achieved by employing this invention. A family of curves yielding different forces and spring rates could, in fact, be acheived by varying the dimensions employed with this invention. These three curves are intended only to show the inter-relationship of force and spring rate.

Referring again to FIG. 6, it can be seen that such spring characteristics would result in a high contact force for a fully deflected contact terminal such as those near the ends of the connector. At the same time a relatively small loss in contact force would result in a partially deflected terminal such as those located in the center of FIG. 6. The combination of end supports and intermediate pivots employed in this invention would lead to a spring with these characteristics. Such a connector would however be somewhat more complicated than a connector with purely end supported terminals such as those disclosed in Application Ser. No. 511,881.

Figure 8:
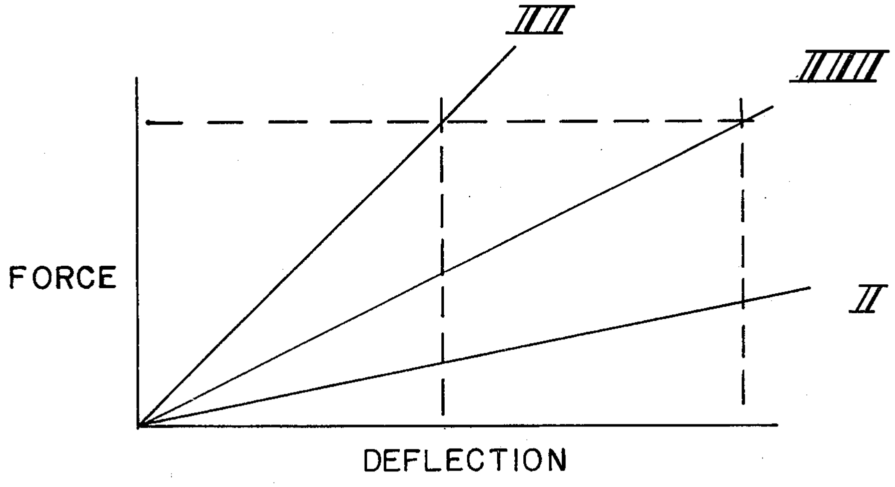
FIG. 8 shows a simplified graphic illustration of certain desirable characteristics for a device to be used as this invention.

A wide variety of connectors for different specific applications can be made in accordance with the general teachings of the invention. For example, the embodiment of FIG. 8 acts in much the same manner as the preferred embodiment comparably shown in FIG. 2. The basic distinguishing characteristics of this alternate embodiment is that segments 64 and 66 form an acute angle while segments 14 and 16 in FIG. 2 form an obtuse angle. This difference results in a reduction of bending stresses in the neighborhood of the contact zone 58 at the expense of increasing complexity. It also results in a more compact design, occupying less space on the interconnected panels. The essence of this invention employing end supports in conjunction with intermediate support points for a conductor spring can also be employed in numerous other connector designs.

What is claimed is:

1. A multi-contact electrical connector for connecting corresponding terminal pads on a first panel-like member to terminal pads on a second panel-like member, said second panel-line member extending parallel to said first panel-like member, said connector comprising:

a contact terminal strip, said terminal strip comprising an elongated strip of insulating film having parallel side edges, a plurality of conductors, being of resilient spring metal, adhered to said film, and extending in parallel side-by-side relationship between said side edges with the opposite ends of said conductors being aligned along said parallel side edges, said conductors being reversely formed with respect to the axis of said film through an angle of substantially 180° so that said terminal strip is generally U-shaped having a central web and opposed sidewalls, with said conductors on the external surface thereof, each of said conductors forming a resilient conductor spring, each of said conductors having first and second contact zones on said external surface, said first and second contact zones facing in opposite directions for engagement with corresponding terminal pads on said first and second panel-like members, and insulating supporting means, said supporting means having first means for supporting said first and second panel-like members in fixed spaced-apart relation at a distance less than the separation of said first and second contact zones when said conductor springs are relaxed and second means for supporting said terminal strip between said panel-like members, said second means comprising multiple pivot means located adjacent to locations intermediate said edges of said strip, said pivot means comprising spaced-apart corners on said supporting means, said conductors abutting one of said corners at each juncture between each of said sidewalls and said web, and restraining means for restraining said opposite ends of said conductors against movement of said ends towards each other when said terminal strip is compressed between said panel-like members, each of said conductors being free to flex between said corners, whereby upon supporting said first and second panel-like members on said first means, said conductors will be resiliently deformed and said contact zones will be engaged with corresponding terminal pads on said first and second panel-like members.

2. A connector as set forth in claim 1 wherein each of said sidewalls is also reversely formed between said contact zones and said ends of said conductors to form a double cantilever spring between said contact zones and said ends.

3. A connector as set forth in claim 2, wherein said insulating supporting means comprises a bar-like member of insulating material with first and second pairs of raised surfaces extending along substantially the entire length of said bar-like member and on two opposite faces of said bar-like member, said first and second raised surfaces being separated by a channel on each of said opposite faces, each of said channels extending along substantially the entire length of said bar-like member.

4. A connector as set forth in claim 3 wherein said conductors are located in surrounding relationship to said second pair of raised surfaces with said opposite ends of said conductors being located in said channels, said conductors being free to flex along their entire length when deformed by forces acting through said contact zones.

5. A connector as set forth in claim 4, wherein said first means for supporting said first and second panel-like members in fixed spaced-apart relation is comprised of said first pair of raised surfaces on opposite faces of said bar-like member, said first raised surfaces being parallel to and spaced-apart from each other.

6. A connector as set forth in claim 5, wherein said pivot means comprises corners formed by the intersection of said second pair of raised surfaces and the lateral side of said bar-like member adjacent to said second pair of raised surfaces.

7. A connector as set forth in claim 6, wherein said restraining means comprises said channels, said opposite ends of said conductors being mounted in oppositely facing channels.

8. A connector as set forth in claim 7, wherein the intersections of said two sidewalls and the central portion of said U-shaped conductors are located in contact with said corners on said second raised surface.

9. A connector as set forth in claim 8, wherein the surfaces formed at the intersection of each of said channels and the corresponding one of said second pair of raised surfaces are co-planar surfaces and are spaced from said corners by a distance such that when said ends of said conductors abut said co-planar surfaces, said conductors are urged against said corners so that said conductors are pivoted about said corners.

10. A connector as set forth in claim 4, wherein said second pair of raised surfaces and said channels constitute said second means for supporting said terminal strip between said panel-like members, said second pair of raised surfaces being parallel and spaced-apart by a distance less than the spacing of said first pair of raised surfaces.

11. A connector as set forth in claim 10, wherein said second pair of raised surfaces are parallel to each other and mutually parallel to said first pair of raised surfaces with the planes of said second pair of raised surfaces both being located between the planes of said first pair of raised surfaces.

12. A connector as set forth in claim 11, wherein the bottom surfaces of said channels are spaced-apart and parallel to each other and to said first and second pair of raised surfaces.

13. A connector as set forth in claim 12, wherein said bar-like members has clamping means for securing said panel-like members to said connector located on either end of said bar-like member.

14. A connector as set forth in claim 3, wherein said first and second contact zones are located at the intersection of two mutually oblique segments of said conductors so that said first and second panel-like members establish contact with said conductors within a relatively small area on said conductors.

15. A connector as set forth in claim 14, wherein the width of portions of said conductor is tapered with said first and second contact zones being located at points of minimum width so that the contact area remains small.

16. An electrical connector for connecting a terminal pad on a first panel-like member with a corresponding terminal pad on a second panel-like member, said connector comprising:

an elongated relatively thin contact terminal of an electrically conductive metal having spring characteristics, said terminal being substantially U-shaped with two sidewalls being joined by a central web with contact means on each of said two sidewalls, each of said sidewalls also being reversely formed between said contact means and the ends of said conductors, substantially rigid supporting means for said terminal, said supporting means having first means for supporting said first and second panel-like members in fixed spaced-apart relation and second means for restraining the ends of said terminal against movement towards each other and for establishing multiple pivot means intermediate the ends of said terminal, said pivot means comprising spaced-apart corners on said supporting means, said terminal abutting one of said corners at each juncture between each of said sidewalls and said web each of said conductors being free to flex between said corners, whereby upon supporting said first and second panel-like members on said first means, said conductors will be resiliently deformed and said contact zones will be engaged with corresponding terminal pads on said first and second panel-like members.

17. A connector as set forth in claim 16, whereby multiple side-by-side terminals are mounted on said supporting means so that contact may be established with multiple terminal pads located in rows along said first and second panel-like members.

18. A multi-contact electrical connector for connecting corresponding terminal pads on a first panel-like member to terminal pads on a second panel-like member, said members being in parallel relationship and being spaced-apart by a predetermined distance with corresponding terminal pads in alignment, said connector comprising:

a contact terminal strip, said strip comprising an elongated strip of insulating film having parallel side edges, a plurality of conductors adhered to one surface of said film, said conductors extending in parallel side-by-side relationship between said side edges, said conductors being bent along a first pair of bend lines which extend parallel to the length of said strip and which are proximate to, and on each side of, the longitudinal center line of said strip whereby said connector strip has a generally U-shaped cross-section having a web portion and sidewalls with said conductors on the external surface thereof, each of said sidewalls being reversely bent along second bend lines which extend parallel to said first pair of bend lines so that each of said sidewalls is also generally U-shaped, insulating supporting means, said supporting means having parallel panel member supporting surface means which are spaced apart by said predetermined distance, said supporting means further having connector strip supporting means for supporting said strip between said panel-like members, said connector strip supporting means having corner supporting surface portions for internally supporting said strip at the internal corners defined by the intersections of said web portions and said sidewalls, and having channel means between said panel member supporting surface means and said corner supporting surface portions, said edges being positioned in said channel means so that substantial movement of said edges towards each other and towards said web portion is prevented, each of said conductors being free to flex between said corners, said sidewalls having contact portions extending laterally beyond said panel member supporting surface means when said conductors are relaxed whereby, upon clamping said panel-like members against said supporting surface means, said sidewalls are flexed towards each other and the portions of each conductor which extend over said sidewalls are flexed in the manner of a beam which is supported at its ends and said conductors are urged against said terminal pads.

19. A multi-contact electrical connector as set forth in claim 18, said sidewalls having marginal edge portions which extend inwardly towards each other and towards sais web, said edges being between said sidewalls and spaced from said web.

20. A multi-contact electrical connector as set forth in claim 18, wherein said corner supporting surface portions consist of two corner surfaces spaced apart by a distance less than said predetermined distance.

* * * * *